United States Patent
Masumura et al.

(10) Patent No.: US 6,386,957 B1
(45) Date of Patent: May 14, 2002

(54) WORKPIECE HOLDER FOR POLISHING, METHOD FOR PRODUCING THE SAME, METHOD FOR POLISHING WORKPIECE, AND POLISHING APPARATUS

(75) Inventors: Hisashi Masumura, Nishishirakawa-gun; Kouichi Tanaka, Nishishiraka-gun; Fumio Suzuki; Kouzi Morita, both of Nishishirakawa; Kouichi Okamura, Nakakubiki-gun; Naotaka Toyama, Gumma-gun, all of (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/581,707

(22) PCT Filed: Oct. 22, 1999

(86) PCT No.: PCT/JP99/05852

§ 371 Date: Jun. 16, 2000

§ 102(e) Date: Jun. 16, 2000

(87) PCT Pub. No.: WO00/25981

PCT Pub. Date: May 11, 2000

(30) Foreign Application Priority Data

Oct. 30, 1998 (JP) .......................................... 10-310121

(51) Int. Cl.[7] ................................................ B24B 1/00
(52) U.S. Cl. ............................ 451/59; 451/41; 451/288
(58) Field of Search .......................... 451/59, 41, 259, 451/384, 287, 288, 289, 28

(56) References Cited

U.S. PATENT DOCUMENTS

| | | | |
|---|---|---|---|
| 4,333,743 A | * | 6/1982 | Nojima ........................ 451/38 |
| 5,398,459 A | * | 3/1995 | Okumura et al. .............. 451/41 |
| 5,626,512 A | * | 5/1997 | Palaikis et al. .............. 451/532 |
| 5,645,474 A | * | 7/1997 | Kubo et al. .................... 451/41 |
| 5,916,412 A | * | 6/1999 | Nakashiba et al. ............ 451/41 |
| 5,934,981 A | * | 8/1999 | Tanaka et al. ................. 451/41 |
| 6,012,964 A | * | 1/2000 | Arai et al. ................... 451/288 |

FOREIGN PATENT DOCUMENTS

| | | |
|---|---|---|
| JP | A-52-155494 | 12/1977 |
| JP | A-63-73625 | 4/1988 |
| JP | A-63-259326 | 10/1988 |
| JP | A-10-156710 | 6/1998 |
| JP | A-11-243135 | 9/1999 |

* cited by examiner

Primary Examiner—Joseph J. Hail, III
Assistant Examiner—Hadi Shakeri
(74) Attorney, Agent, or Firm—Oliff & Berridge, PLC

(57) ABSTRACT

By improving the material of workpiece holder body of a workpiece holder for polishing that holds a workpiece by vacuum adsorption, and the material of resin film for coating a workpiece holding surface of the holder, and developing a method for coating the surface with a resin, which does not cause blocking of perforated holes of the holder body with the resin during the resin coating process, there are provided a workpiece holder for polishing having a workpiece holding surface of high precision, and a method for producing it. According to the present invention, there are provided a workpiece holder for polishing having a workpiece holder body provided with multiple perforated holes for holding a workpiece by vacuum adsorption, wherein a holding surface of the holder body is coated with a coating film formed by applying a thermosetting resin on the holding surface and curing it with heating, and a surface of the coating film is polished, and a method for producing it.

12 Claims, 2 Drawing Sheets

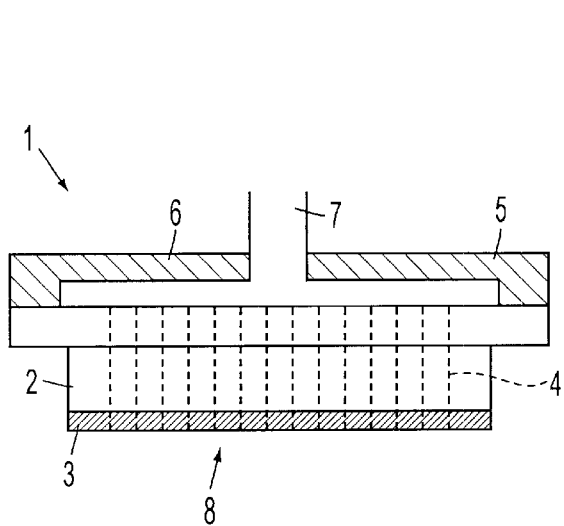
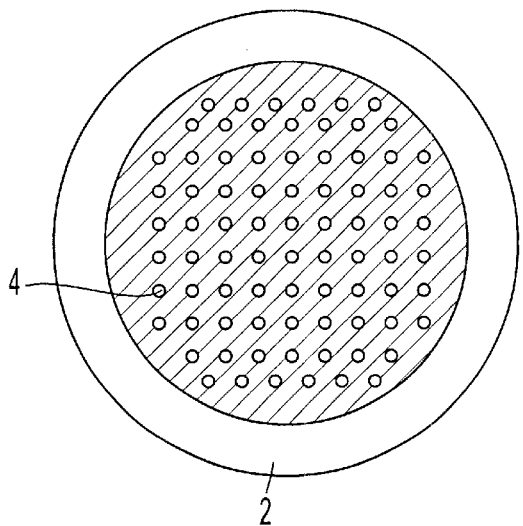
FIG. 1(a)  FIG. 1(b)
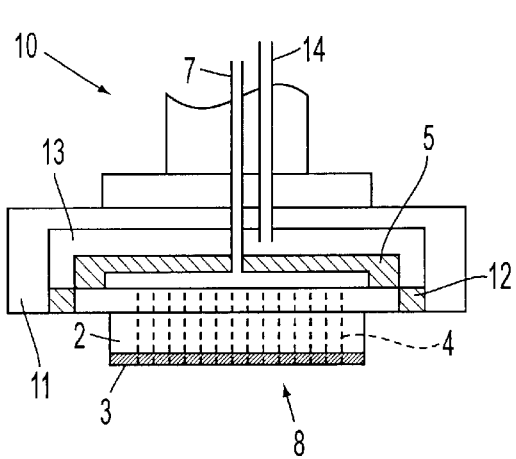
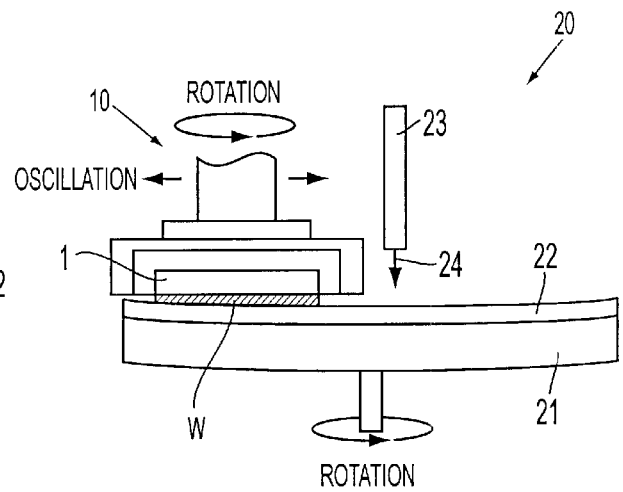
FIG. 2(a)  FIG. 2(b)

STEP (a)
DEGASSING OF THERMOSETTING RESIN BY KNEADING UNDER VACUUM

STEP (b)
COATING OF THERMOSETTING RESIN

STEP (c)
LEVELING OF RESIN LAYER THICKNESS

STEP (d)
HEAT CURING OF THERMOSETTING RESIN LAYER

STEP (e)
SURFACE CORRECTION BY LAPPING

STEP (f)
CLEANING

STEP (g)
SURFACE CORRECTION BY POLISHING

WORKPIECE HOLDER FOR POLISHING, METHOD FOR PRODUCING THE SAME, METHOD FOR POLISHING WORKPIECE, AND POLISHING APPARATUS

TECHNICAL FIELD

The present invention relates to a workpiece holder for polishing which is used for precision polishing of surfaces of workpieces such as semiconductor wafers, method for producing the holder, method for polishing a workpiece, and polishing apparatus.

BACKGROUND ART

In the conventional polishing operation, a plate composed of a rigid material such as glass, metal and ceramics is used as a workpiece holder, and a workpiece is held by adhering it on the surface of the holder with an adhesive such as wax, or by vacuum adsorption using a workpiece holder surface composed of a gas-permeable porous material or a workpiece holder surface provided with many perforated holes. However, if a workpiece is held directly on a workpiece holder surface composed of metal, ceramics or the like, cracks or stains may be generated on the back surface of the workpiece. Therefore, in order to prevent such a phenomenon, for example, it has been proposed to coat the workpiece holder surface with an extremely thin resin film having a thickness of several tens micrometers and composed of a material such as those known with the trade names of Teflon, Nylon etc. or polyvinyl chloride as disclosed in Japanese Patent Application Laid-open (Kokai) No. 58-180026, or there has been proposed a vacuum plate comprising an acrylic resin plate provided with holes for vacuum adsorption and adhered to a workpiece holder surface, wherein the resin surface is subjected to a polishing process afterward, as disclosed in Japanese Patent Application Laid-open (Kokai) No. 4-206930.

Further, there has been a problem in a polishing process that, even if the workpiece holder has a flat finished surface, a flat workpiece cannot necessarily be obtained after the processing because of the use of a soft polishing pad for polishing. That is, surface conditions of the polishing pad may be gradually changed by creep deformation of the polishing pad and so forth. There has also been proposed a method for producing an adsorption plate fitted to the creep deformation of the polishing pad as a part of the workpiece holder surface by coating the workpiece holder surface with a thin resin layer and polishing the surface, as disclosed in the aforementioned Japanese Patent Application Laid-open (Kokai) No. 58-180026. However, this method suffers from a problem that, because the resin layer is thin, it is worn out within a short period of time, and thus it becomes unsuitable for use.

Furthermore, when resin is coated on a workpiece holder surface with coating techniques such as spraying, there may be also arisen a problem that the holes provided in the workpiece holder surface for the vacuum adsorption are blocked with the resin. Therefore, Japanese Patent Application Laid-open (Kokai) No. 4-206930 proposed a method comprising adhering an acrylic resin plate provided with holes and having a thickness of 3–50 mm on a workpiece holder surface, and carrying out polishing directly on a polishing turn table of polishing apparatus. However, in this method, there is arisen a problem that, because the acrylic resin plate is adhered on the workpiece holder surface, the holes may be blocked with an adhesive or the adsorption plate may be exfoliated during the processing.

Further, according to findings obtained by the inventors of the present invention, when a resin plate having a thickness of 5 mm or more is used, the rigidity of the workpiece holder surface is degraded, and hence there is caused a problem of degraded polishing precision for workpieces. On the other hand, when a resin plate having a thickness of 3 mm or less is used, there is arisen a problem that unevenness of adhesive between the resin plate and the workpiece holder body is transferred to the surface of workpiece.

Furthermore, the workpiece holder body, which is usually made of metal, glass or the like, shows slightly different heat generation profiles for polishing of a workpiece holder surface adhered with a resin plate or the like on an polishing apparatus for forming its surface shape, and the subsequent polishing of a workpiece held on the surface. Thus, there is also arisen a problem that the workpiece holder body itself is deformed by heat to cause deformation of the surface shape of the workpiece holder produced with much troubles, which makes the shape of the workpiece after the polishing irregular.

DISCLOSURE OF THE INVENTION

Therefore, the present invention was accomplished in view of the aforementioned problems, and its main object is to improve the material of holder body of a workpiece holder for polishing that holds a workpiece by vacuum adsorption, and the material of resin film for coating a workpiece holding surface of the holder, and develop a method for coating the surface with a resin, which does not cause blocking of perforated holes of the holder body with the resin during the surface coating process with the resin, thereby providing a workpiece holder for polishing having a workpiece holding surface of high precision, and a method for producing it.

In order to achieve the aforementioned object, the present invention provides a workpiece holder for polishing having a workpiece holder body provided with multiple perforated holes for holding a workpiece by vacuum adsorption, wherein a holding surface of the holder body is coated with a coating film formed by applying a thermosetting resin on the holding surface and curing it with heating, and a surface of the coating film is polished.

By using a workpiece holding surface of the holder body coated with a coating film which is formed by applying a thermosetting resin on the surface and curing it with heating, and has a polished surface as described above, the unevenness of the adhesion can be eliminated, which has been generated in the previous cases where a resin plate is adhered to a workpiece holding surface of a holder body with an adhesive. As a result, the problems, i.e., the transfer of uneven adhesion between the resin plate and the workpiece holder during the polishing and so forth, are eliminated, and thus it becomes possible to perform high precision polishing of workpieces with the desired high flatness and no waviness thanks to the high precision holding surface of the resin coating film itself.

In this case, the thermosetting resin can be one selected from epoxy resins, unsaturated polyester resins, urethane resins and phenol resins.

By using a material selected from those mentioned above as the thermosetting resin, physical properties of the coating film after the heat curing required for the present invention, including hardness, mechanical strength, coefficient of linear thermal expansion and so forth, can be satisfied.

Further, in this case, viscosity of the thermosetting resin is preferably 10,000 cps or higher, and it is preferred that it is degassed by kneading under vacuum.

By using a thermosetting resin of high viscosity as described above, it becomes possible to easily prevent the blocking of perforated holes of a small diameter for vacuum adsorption provided in the resin coating film after the heat curing.

Moreover, if air bubbles remain inside the resin coating film or on the surface thereof after heat curing, they are transferred to the surface of workpiece during the workpiece polishing. Therefore, the thermosetting resin of high viscosity is preferably kneaded under sufficient vacuum for degassing before it is applied to the holding surface of the workpiece holder so that air in the resin should be removed.

Further, in this case, the resin coating film covering the holding surface of the holder body preferably has a thickness of 0.5 to 3 mm, and the surface of the resin coating film is preferably subjected to correction by lapping and then correction by polishing on a polishing turn table of a polishing apparatus.

When a resin coating film having a thickness of 3 mm or less is used as defined above, the rigidity of the workpiece holder body is not degraded, and thus polishing of workpieces can be realized with higher precision. And high flatness can be obtained with a thickness of 0.5 mm or more. Further, by subjecting the surface of the heat-cured resin coating film first to surface correction by lapping and then correction by polishing on a polishing turn table of a polishing apparatus, a holding surface of holder body of higher precision can be formed, and use of this workpiece holder enables workpiece polishing providing high flatness.

Further, the diameter of the perforated holes of the workpiece holder body can be selected from the range of 0.4 to 0.8 mm, and coefficient of linear thermal expansion of the material of the workpiece holder body is desirably $1\times10^{-5}/°$C. or less. In addition, the material of the workpiece holder body is preferably silicon carbide (SiC).

If a diameter of the perforated holes of 0.4 mm or larger is used as described above, the holes become unlikely to be blocked with the resin when the resin coating film is formed on the holding surface of the holder body. On the other hand, a diameter of 0.8 mm or less can prevent the transfer of the traces of the holes due to unduly large holes during the polishing of a workpiece.

Further, by forming the workpiece holder with a material of a low coefficient of thermal expansion, difference of the thermal deformation degrees of the workpiece holder body during the polishing of the holding surface of the workpiece holder body on a polishing turn table of a polishing apparatus and the polishing of a workpiece can be reduced. Therefore, the high precision holding surface shape of the workpiece holder can be maintained, and thus workpiece polishing providing high flatness can be realized.

As a material of a particularly low coefficient of thermal expansion, high rigidity and corrosion resistance that makes the material unlikely to be corroded by polishing solution and so forth, silicon carbide is preferred.

The present invention further provides a method for producing a workpiece holder for polishing having a workpiece holder body provided with multiple perforated holes for holding a workpiece by vacuum adsorption and a holding surface coated with a resin, which comprises coating a holding surface of the workpiece holder body with a thermosetting resin, curing the thermosetting resin by heating to form a resin coating film while passing a gas through the perforated holes from a back face of the workpiece holder body, and subjecting a surface of the resin coating film to correction by lapping and then correction by polishing on a polishing turn table of a polishing apparatus.

According to this production method, the thermosetting resin can be cured without blocking the multiple holes of a small diameter provided in the workpiece holder body, and the thermosetting resin coating film can be formed without causing problems such as unevenness of adhesion on the holding surface of the workpiece holder body.

Moreover, by subjecting the surface of the heat-cured resin coating film to surface correction by lapping and then-correction by polishing on a polishing turn table of a polishing apparatus, the holding surface shape of the holder body can be formed with high precision, and thus it becomes possible to perform polishing of workpieces with high flatness.

In this case, when the holding surface of the workpiece holder body is coated with a thermosetting resin in the aforementioned production method, the thermosetting resin in the vicinity of the perforated holes can be preliminarily cured while passing a heated gas through the perforated holes from a back face of the workpiece holder body, and then the remaining resin can be cured by heating. Further, temperature of the gas can be set at a temperature the same as or higher than the heat curing temperature of the aforementioned thermosetting resin.

According to this method, since the resin in the vicinity of the perforated holes is cured first, the blocking of the perforated holes can more surely be prevented. Further, while the gas can be set at a temperature the same as or higher than the heat curing temperature of the aforementioned thermosetting resin, if the gas temperature is too high, curing rate in the vicinity of the perforated holes becomes high, and thus hardness of the resin may be different between the vicinity of the perforated holes and the other areas. This may make it impossible to perform the polishing with high precision. Further, heat curing reaction rate of the resin becomes a more potent rate-determining factor rather than the viscosity decreasing rate by heating. Therefore, in order to prevent the blocking of the perforated holes, the temperature is preferably substantially the same as the heat curing temperature of the thermosetting resin.

The present invention provides a method for polishing a workpiece, which comprises holding a workpiece on its back face by vacuum adsorption on the resin coating film surface used as a workpiece holding surface of the aforementioned workpiece holder body for polishing, and contacting the workpiece with a polishing pad to polish a surface of the workpiece.

According to the present invention, a holding surface shape of a workpiece polishing holder body can be formed with higher precision. Therefore, by using this workpiece holder for polishing, it becomes possible to perform high precision polishing of workpieces with the desired high flatness and no waviness.

The present invention further provides an apparatus for polishing a workpiece comprising a turning table provided with a polishing pad by adhesion, means for feeding a polishing agent to a surface of the polishing pad, and a workpiece holder for polishing which forcibly brings a workpiece into contact with a surface of the polishing pad with pressure, wherein the workpiece holder for polishing is the aforementioned workpiece holder for polishing.

By using a polishing apparatus comprising a workpiece holder for polishing wherein a thermosetting resin coating film is formed on a holding surface of a workpiece holder body as described above, a workpiece can be polished so that the desired high flatness should be obtained with no waviness. When the workpiece is a semiconductor wafer, in particular, the defocus failure in lithographic light exposure in the production process of highly integrated devices can be reduced, and thus yield and productivity of highly integrated devices can be improved.

As explained above, a workpiece holder for polishing having a workpiece holding surface of high precision can be provided by the present invention. Therefore, a workpiece having a surface with high flatness and no waviness can be produced by using this holder for polishing. In particular, when the workpiece is a semiconductor wafer which is polished by using the workpiece holder for polishing of the present invention, the defocus failure in lithographic light exposure in the production process of highly integrated devices can be reduced, and yield of highly integrated devices can be improved.

BRIEF DESCRIPTION OF THE DRAWINGS

FIG. 1 represents schematic explanatory views of a workpiece holder for polishing of the present invention: (a); longitudinal sectional view, and (b) front view of the workpiece holding surface.

FIG. 2 represents schematic explanatory views of a polishing head provided with a workpiece holder for polishing of the present invention and a polishing apparatus having the polishing head: (a) the polishing head and (b) the workpiece polishing apparatus.

BEST MODE FOR CARRYING OUT THE INVENTION

Figure 3:
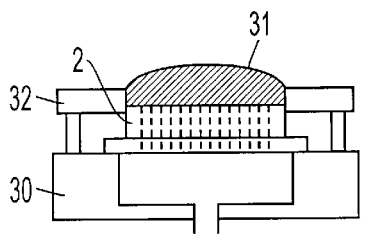
FIGS. 3(a) to (g) show a flow of a process for producing a workpiece holder for polishing of the present invention.
Figure 3:
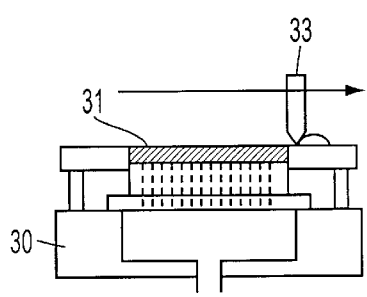
Figure 3:
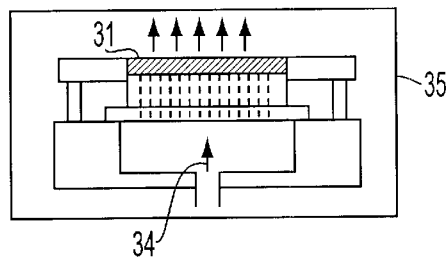
Figure 3:
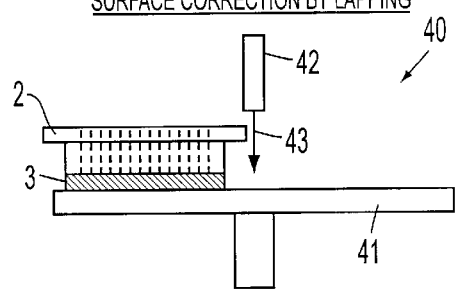
Figure 3:
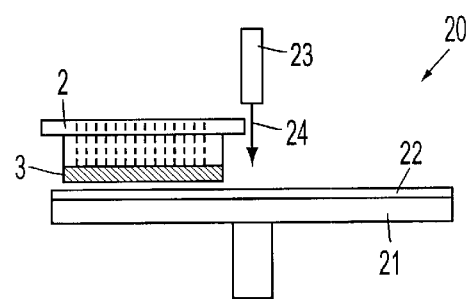

Hereafter, embodiments of the present invention will be explained. However, the present invention is not limited to these.

As explained above, conventional workpiece holders for polishing, in particular, holders wherein a plastic plate is adhered with an adhesive on a holding surface of a workpiece holder body, suffer problems. For example, upon adhesion, the adhesive may be squeezed and block the perforated holes, or the rigidity of the holder surface is degraded by the use of a thick plastic plate, which leads to degraded polishing precision of workpieces. On the other hand, when the plastic plate is thin, there may be arisen a problem that unevenness of the adhesive between the resin plate and the workpiece holder is transferred to the workpiece surface and thus produces waviness.

Therefore, in order to solve these problems, the inventors of the present invention searched and studied about the material of workpiece holder body, the material and structure of the holding surface and so forth. As a result, it was found that a workpiece with high flatness and no waviness could be obtained by holding a workpiece by vacuum adsorption on a coating film of thermosetting resin, which is directly coated on a holding surface of a workpiece holder body, and polishing it by a polishing apparatus. Then, they defined various conditions for practically utilizing this finding, and thus accomplished the present invention.

First, a polishing apparatus utilizing the workpiece holder for polishing of the present invention will be explained with reference to the appended drawings. FIG. 1 represents schematic explanatory views for illustrating the general structure of the workpiece holder for polishing as an example of the present invention. FIG. 2 represents explanatory views for illustrating the general structures of a polishing head provided with the workpiece holder for polishing (a) and a polishing apparatus provided with the polishing head (b).

The polishing apparatus of the present invention is designed as an apparatus for polishing one surface of a workpiece, for example, a semiconductor wafer, and as shown in FIG. 2(b), the polishing apparatus 20 consists of a rotating polishing turn table (turning table) 21, a workpiece holder 1 for polishing mounted on a polishing head 10, and a polishing agent feeding nozzle 23. A polishing pad 22 is adhered on the upper surface of the polishing turn table 21. The polishing turntable 21 is rotated at a predetermined rotation speed by a rotating shaft.

The workpiece holder 1 for polishing holds a workpiece (wafer) W on its workpiece holding surface 8 by vacuum adsorption or the like, and mounted on the polishing head 10 having the rotation shaft. The holder is rotated by the polishing head 10 and simultaneously presses the workpiece W against the polishing pad 22 at a predetermined load. A polishing agent 24 is fed from the nozzle 23 at a predetermined flow rate on the polishing pad 22, and then fed between the workpiece W and the polishing pad 22, and thus the workpiece W is polished.

Further, as represented in FIG. 1 and FIG. 2(a), the workpiece holder 1 for polishing of the present invention is constituted by a workpiece holder body 2 having a workpiece holding surface 8 and multiple perforated holes 4 for vacuum adsorption, and a workpiece holder back plate 5. The perforated holes 4 are communicated to a vacuum apparatus not shown in the figure via a space 6 located between the workpiece holder body 2 and the workpiece holder back plate 5, and a vacuum way 7, and the workpiece W is held on the workpiece holding surface 8 upon generation of vacuum. According to the present invention, in particular, the workpiece holding surface 8 of the workpiece holder body 2 is coated with a thermosetting resin coating film 3 which has perforated holes 4.

The polishing head 10 has a pressurized space 13 in its rotating holder 11, and holds the workpiece holder 1 for polishing airtightly via an elastomer ring 12. The pressurized space 13 communicates with an air compressor (now shown) via a pressurization way 14. The workpiece holder 1 which holds the workpiece W on the surface of resin coating film 3 of the workpiece holding surface 8 by vacuum adsorption is rotated or oscillated, and at the same time, the back face of the workpiece holder 1 is pressurized with air so as to press the workpiece holder 1 against the polishing pad 22.

Now, an exemplary process of the method for producing of the workpiece holder for polishing of the present invention will be explained with reference to the flow diagram shown in FIG. 3.

First, in the step (a), a thermosetting resin is charged in a mixing chamber, and sufficiently degassed under vacuum to eliminate air contained in it.

In the step (b), the workpiece holder body 2 of the workpiece holder 1 for polishing is placed on a resin application jig 30 so that the workpiece holding surface 8 should be the upper side, and after a coating amount adjusting plate 32 is set, the thermosetting resin 31 is poured on the workpiece holding surface 8.

In the step (c), a bar 33 is slid on the coating amount adjusting plate 32 to scrape excessive resin so that a resin layer having a uniform thickness should be formed.

Subsequently, in the step (d), the workpiece holder body 2 on which the resin has been applied is placed in an electric heating furnace 35 together with the resin application jig 30, and heating is started so that the whole resin layer 31 should be cured, while heated gas 34 is passed through the perforated holes 4 of the workpiece holder body 2 from below the resin application jig 30. In this case, the resin 31 in the vicinity of the perforated holes 4 can be preliminarily cured, and then the remainder resin can be cured. In such a case, because the resin in the vicinity of the perforated holes is cured first, the blocking of the perforated holes 4 can more surely be prevented.

The temperature of the gas 34 for the heat curing may be the same as or higher than the heat curing temperature of the resin. If it is the same as the heat curing temperature of the resin, the heat curing reaction rate of the resin will become a more potent rate-determining factor rather than the viscosity decreasing rate of the resin by heating. Therefore, the resin coating film 3 can be formed without blocking the perforated holes, and thus it is preferred.

Then, in the step (e), the workpiece holder body 2 coated with the resin coating film 3 is mounted on a lapping machine 40, and a lapping solution 43 is added dropwise from a nozzle 42, while rotating a turn table 41, to grind the surface of the resin coating film 3 thereby performing surface correction. The surface is then sufficiently cleaned in the step (f).

Further, in the step (g), the workpiece holder body 2 coated with the resin coating film 3 after the lapping correction is mounted on a polishing apparatus 20, and a polishing agent 24 is added dropwise from a nozzle 23, while rotating a turn table 21, to polish the surface of the resin coating film 3 thereby performing surface correction. After sufficient cleaning, the workpiece holder body 2 can be completed, and a workpiece holder back plate 5 is attached to it to produce a workpiece holder 1 for polishing.

The workpiece holder 1 for polishing manufactured through the steps described above can be fixed to a polishing head 10, which can then be mounted on a polishing apparatus 20. By using this, polishing can be performed by holding the workpiece W on the surface of resin coating film 3 of the workpiece holding surface 8 of workpiece holder body 2 by vacuum adsorption, and pressing the workpiece against the rotating polishing pad 22 while adding the polishing agent 24 dropwise. By performing the polishing as described above, the unevenness of adhesion can be eliminated, which is generated in a conventional technique where a resin plate is adhered on a workpiece holding surface of a holder body with an adhesive. As a result, waviness due to transfer to the workpiece surface of unevenness of adhesion between the resin plate and the workpiece holder during the polishing can be eliminated, and thus it becomes possible to perform high precision polishing affording the desired high flatness and no waviness thanks to the high precision holding surface of the resin coating film itself, and workpieces of high precision with high flatness and no waviness can be produced with good yield and high productivity.

The thermosetting resin used for the present invention can be one selected from epoxy resins, unsaturated polyester resins, urethane resins and phenol resins. Among these, epoxy resins can sufficiently satisfy the physical properties of the coating film after heat curing required for the present invention, including hardness, mechanical strength, coefficient of linear expansion and so forth.

Further, the thermosetting resin desirably has a viscosity of 10,000 cps or more. By using a resin of such a high viscosity, it becomes possible to relatively easily form the perforated holes of a small diameter for holding by vacuum adsorption in the resin coating film after the heat curing.

Moreover, before applying the thermosetting resin to the workpiece holding surface, it is preferably degassed beforehand by kneading under vacuum. If air bubbles remain inside the resin coating film after the heat curing or on its surface, the air bubbles or traces thereof are transferred to the workpiece surface during the polishing of the workpiece. Therefore, before applying the thermosetting resin of a high viscosity to the workpiece holding surface of the workpiece holder, it is desirably degassed by kneading under sufficient vacuum so that the air contained in the resin should be eliminated.

Furthermore, the resin coating film coating the holding surface of the workpiece holder body desirably has a thickness of 0.5 to 3 mm. Further, the surface of resin coating film is preferably subjected to correction by lapping and then correction by polishing on a polishing turn table of a polishing apparatus.

If the resin coating film has a thickness of 3 mm or less as described above, the rigidity of the workpiece holder body will not be reduced, and hence workpiece polishing can be performed with higher precision. On the other hand, a thickness of 0.5 mm or more can provide high flatness.

Further, if the surface of resin coating film after the heat curing is first subjected to surface correction by lapping and then correction by polishing on a polishing turn table of a polishing apparatus, a shape of the holding surface of the holder body can be formed with higher precision, and use of such a workpiece holder enables workpiece polishing affording high flatness.

As for the characteristics of the workpiece holder body, the perforated holes preferably have a diameter of 0.4 to 0.8 mm, the material of the workpiece holder body desirably has a coefficient of linear thermal expansion of $1\times10^{-5}/°$ C. or less, and the material of the workpiece holder body is preferably composed of a sintered body (ceramics) of silicon carbide (SiC).

If the perforated holes have a diameter of 0.4 mm or more as defined above, the possibility of the blocking of the holes with the resin is eliminated when the resin coating film is formed with the thermosetting resin on the holding surface of the holder body. On the other hand, if the diameter is 0.8 mm or less, transfer of traces of the holes during the polishing of the workpiece due to an unduly large diameter can be prevented.

Further, by forming the workpiece holder body with a material of a low coefficient of linear thermal expansion, difference of the thermal deformation degrees of the workpiece holder body between during the polishing of the holding surface of the workpiece holder body on a polishing turn table of a polishing apparatus and during the polishing of a workpiece can be reduced, and therefore the shape of the holding surface of the workpiece holder of high precision can be maintained. Thus, workpiece polishing providing high flatness can be realized. As a material of a particularly low coefficient of thermal expansion, high rigidity and corrosion resistance that makes the material unlikely to be corroded by polishing solution and so forth, silicon carbide is preferably used.

Hereafter, the present invention will be specifically explained with reference to the following examples. However, the present invention is not limited to these.

EXAMPLE 1

(1) A workpiece holder for polishing having the structure shown in FIG. 1 was used.
(2) A polishing apparatus for workpieces having the structure shown in FIG. 2(b) was used.
(3) Workpiece: silicon wafer; diameter=200 mm; thickness= 735 μm (4) Surface resin coating film on holding surface of workpiece holder body: thermosetting epoxy resin; viscosity= 15000 cps; coating film thickness=1 mm
(5) Workpiece holder body: porous plate of silicon carbide (SiC) having a thickness of 30 mm; pore diameter=0.4 mm; coefficient of thermal expansion=$4 \times 10^{-6}/°$ C.
(6) Workpiece polishing conditions: polishing load=300 g/cm$^2$; polishing relative velocity=50 m/min; polishing stock removal=10 $\mu$m; polishing pad nonwoven fabric polishing pad (Asker C hardness of 90 according to JIS K6301); polishing agent=colloidal silica (pH 10.5)
(7) Polishing conditions for holding surface of workpiece holder body: resin coating film polishing stock removal= 40 $\mu$m; other conditions are the same as those for the conditions for workpiece polishing mentioned above.

Under the aforementioned conditions of (1), (4) and (5), a workpiece holder having a diameter slightly larger than that of a workpiece was produced, and a resin coating film surface on the holding surface of the workpiece holder body was polished. Then, a workpiece was held on its surface and polished. Flatness of the workpiece was measured by a thickness gage of electrostatic capacitance type (ADE9700), and waviness on the surface of the workpiece was observed by a magic mirror.

As a result, there was achieved a high flatness of the workpiece, i.e., 0.20 $\mu$m in terms of SBIRmax (Site Backside Ideal Range: a value standardized by SEMI standard M1 etc., cell size 25×25) of back side reference. Further, no waviness was observed on the workpiece surface even with a magic mirror, and thus highly precise polishing was attained.

EXAMPLE 2

A workpiece holder was produced under the same conditions as in Example 1 except that the thickness of the resin coating film formed on the holding surface of the workpiece holder body was set to be 3 mm, and polishing of the workpiece was performed under the same conditions.

As a result, there was achieved a high flatness of the workpiece, i.e., 0.25 $\mu$m in terms of SBIRmax (cell size 25×25) of back side reference. Further, no waviness was observed on the workpiece surface even with a magic mirror, and thus highly precise polishing was attained.

EXAMPLE 3

A workpiece holder body was produced under the same conditions as in Example 1 except that the diameter of the holes for vacuum adsorption of the workpiece holder body was set to be 0.3 mm, 0.8 mm or 1.2 mm, and polishing of the workpiece was performed under the same conditions.

As a result, when the diameter was 0.3 mm, some of the holes might be blocked, and require processing for correction. When the diameter was 0.8 mm, there might be observed slight transfer of the holes for vacuum adsorption on the workpiece surface observed by a magic mirror after the polishing. When the diameter was 1.2 mm, there was clearly observed transfer of the holes for vacuum adsorption. Therefore, it was confirmed that the diameter was preferably 0.4 to 0.8 mm.

EXAMPLE 4

A workpiece holder body was produced under the same conditions as in Example 1 except that the thermosetting epoxy resin to be applied to the holding surface of the workpiece holder body was not degassed by kneading under vacuum before use, and polishing of the workpiece was performed under the same conditions.

As a result, while a result similar to that of Example 1 was obtained for the most cases, there might be generated waviness on the workpiece surface observed by a magic mirror after the polishing, which was considered to be caused by transfer of air bubbles in the resin coating film.

EXAMPLE 5

A workpiece holder body was produced under the same conditions as in Example 1 except that stainless steel (coefficient of linear thermal expansion: $12 \times 10^{-6}/°$ C.) or alumina (ceramics, coefficient of linear thermal expansion: $7 \times 10^{-6}/°$ C.) was used as the material of the workpiece holder body,.and polishing of the workpiece was performed under the same conditions.

As a result, the flatness of back side reference of the workpiece, SBIRmax, was 0.3 $\mu$m when stainless steel was used, and 0.25 $\mu$m when alumina was used.

Comparative Example 1

A workpiece holder body was produced under the same conditions as in Example 1 except that one of three kinds of porous epoxy resin plates each having a thickness of 1 mm, 3 mm or 5 mm was adhered to the holding surface of the workpiece holder body with an epoxy resin adhesive, and polishing of the workpiece was performed under the same conditions.

As a result, the flatness of back side reference of the workpiece, SBIRmax, was gradually degraded as the thickness of the resin plate became thicker. That is, it was 0.40 $\mu$m for the thickness of 1 mm, 0.50 $\mu$m for the thickness of 3 mm, and 0.70 $\mu$m for the thickness of 5 mm. Conversely, the waviness on the workpiece surface (in this case, this refers to the transfer of unevenness of adhesion between the resin plate and the workpiece holder body) observed by a magic mirror became larger as the resin plate became thinner. Thus, the obtained polished workpieces were defective even considering both of the flatness and the waviness.

The present invention is not limited to the embodiments described above. The above-described embodiments are mere examples, and those having the substantially same structure as that described in the appended claims and providing the similar functions and advantages are included in the scope of the present invention.

What is claimed is:

1. A workpiece holder for polishing comprising a workpiece holder body provided with multiple perforated holes for holding a workpiece by vacuum adsorption, wherein a holding surface of the holder body is coated with a coating film formed by applying a thermosetting resin having a viscosity of 10,000 cps or higher, which has been degassed by kneading under vacuum, on the holding surface and curing the thermosetting resin by heating, and a surface of the coating film is polished.

2. The workpiece holder for polishing according to claim 1, wherein the thermosetting resin is selected from the group consisting of epoxy resins, unsaturated polyester resins, urethane resins and phenol resins.

3. The workpiece holder for polishing according to claim 1, wherein the resin coating film covering the holding surface of the holder body has a thickness of 0.5 to 3 mm.

4. The workpiece holder for polishing according to claim 1, wherein the surface of the resin coating film is subjected to correction by lapping and then to correction by polishing on a polishing turn table of a polishing apparatus.

5. The workpiece holder for polishing according to claim 3, wherein the surface of the resin coating film is subjected to correction by lapping and then to correction by polishing on a polishing turn table of a polishing apparatus.

6. The workpiece holder for polishing according to claim 1, wherein the perforated holes of the workpiece holder body have a cylindrical shape and a diameter which is within the range of 0.4 to 0.8 mm.

7. The workpiece holder for polishing according to claim 1, wherein a coefficient of linear thermal expansion of a material of the workpiece holder body is $1\times10^{-5}/°$ C. or less.

8. The workpiece holder for polishing according to claim 1, wherein the workpiece holder body is comprised of silicon carbide (SiC).

9. A method for producing a workpiece holder for polishing having a workpiece holder body provided with multiple perforated holes for holding a workpiece by vacuum adsorption and a holding surface coated with a resin, comprising:

coating a holding surface of the workpiece holder body with a thermosetting resin;

preliminarily curing the thermosetting resin around the perforated holes while passing a heated gas through the perforated holes from a back face of the workpiece holder body;

then curing the remaining thermosetting resin by heating to form a resin coating film; and subjecting a surface of the resin coating film to correction by lapping and then to correction by polishing on a polishing turn table of a polishing apparatus.

10. The method for producing a workpiece holder for polishing according to claim 9, wherein a temperature of the gas is set as the same as, or higher than, a heat curing temperature of the thermosetting resin.

11. A method for polishing a workpiece, comprising:

holding a workpiece on a back face of the workpiece by a workpiece holder comprising a workpiece holder body provided with multiple perforated holes for holding the workpiece by vacuum adsorption, wherein a holding surface of the holder body is coated with a coating film formed by applying a thermosetting resin having a viscosity of 10,000 cps or higher, which has been degassed by kneading under vacuum, on the holding surface and curing the thermosetting resin by heating, and a surface of the coating film is polished; and contacting the workpiece with a polishing pad to polish a surface of the workpiece.

12. An apparatus for polishing a workpiece, comprising:

a turning table provided with a polishing pad by adhesion;

means for feeding a polishing agent to a surface of the polishing pad; and a workpiece holder for polishing comprising a workpiece holder body provided with multiple perforated holes for holding a workpiece by vacuum adsorption, wherein a holding surface of the holder body is coated with a coating film formed by applying a thermosetting resin having a viscosity of 10,000 cps or higher, which has been degassed by kneading under vacuum, on the holding surface and curing the thermosetting resin by heating, and a surface of the coating film is polished, which forcibly brings a workpiece into contact with the surface of the polishing pad with pressure.

* * * * *